United States Patent [19]

Lin et al.

[11] Patent Number: 5,273,938
[45] Date of Patent: Dec. 28, 1993

[54] METHOD FOR ATTACHING CONDUCTIVE TRACES TO PLURAL, STACKED, ENCAPSULATED SEMICONDUCTOR DIE USING A REMOVABLE TRANSFER FILM

[75] Inventors: Paul T. Lin; Michael B. McShane, both of Austin, Tex.

[73] Assignee: Motorola, Inc., Schaumburg, Ill.

[21] Appl. No.: 876,315

[22] Filed: Apr. 30, 1992

Related U.S. Application Data

[63] Continuation-in-part of Ser. No. 756,952, Sep. 9, 1991, Pat. No. 5,200,362, which is a continuation-in-part of Ser. No. 576,255, Aug. 31, 1990, abandoned.

[30] Foreign Application Priority Data

Sep. 6, 1989 [JP] Japan .............................. 1-1231323

[51] Int. Cl.⁵ .................... H01L 21/28; H01L 21/70; H01L 21/56; H01L 21/60
[52] U.S. Cl. .................... 437/207; 437/208; 437/211
[58] Field of Search ............... 437/915, 207, 208, 211, 437/214; 228/180.2; 257/777, 790, 679

[56] References Cited

U.S. PATENT DOCUMENTS

| | | | |
|---|---|---|---|
| 4,460,825 | 7/1984 | Haghiri-Tehrani et al. | 257/679 |
| 4,530,152 | 7/1985 | Roche et al. | 437/211 |
| 4,635,356 | 1/1987 | Ohuchi et al. | 437/211 |
| 4,830,264 | 5/1989 | Bitaillou et al. | 228/180.2 |
| 4,961,105 | 10/1990 | Yamamoto | 257/679 |
| 5,122,860 | 6/1992 | Kikuchi et al. | 257/679 |

FOREIGN PATENT DOCUMENTS

| | | | |
|---|---|---|---|
| 53-5571 | 1/1978 | Japan | 437/211 |
| 54-71986 | 6/1979 | Japan | 437/211 |
| 62-8529 | 1/1987 | Japan | 437/211 |
| 62-124749 | 6/1987 | Japan | 437/211 |
| 62-219531 | 9/1987 | Japan | 437/214 |
| 63-283136 | 11/1988 | Japan | 437/211 |
| 1-161724 | 6/1989 | Japan | 437/211 |

*Primary Examiner*—Olik Chaudhuri
*Assistant Examiner*—David E. Graybill
*Attorney, Agent, or Firm*—Patricia S. Goddard

[57] ABSTRACT

A low cost manufacturing method is used to fabricate a small multichip semiconductor device (30). In one embodiment, a pattern of conductive traces (13) is formed on a film of transfer material (12). A first semiconductor die (15) is interconnected to the traces and a resin body (20) is formed around the first die and one side of the traces. The film of transfer material forms, at this stage of the process, one side of the first package. The film of transfer material is then peeled from the pattern of conductive traces and the first resin body to expose the other side of the traces. A second semiconductor die (23) is interconnected to the exposed side of the traces. A second resin body (25) is formed around the second die and portions of the exposed traces. Solder balls (26) are coupled to the exposed portions of the traces to establish external electrical connections to each die.

14 Claims, 4 Drawing Sheets

METHOD FOR ATTACHING CONDUCTIVE TRACES TO PLURAL, STACKED, ENCAPSULATED SEMICONDUCTOR DIE USING A REMOVABLE TRANSFER FILM

CROSS-REFERENCE TO RELATED APPLICATION

This application is a continuation-in-part of a copending patent application entitled, "Resin Encapsulated Semiconductor Device and Method for Its Fabrication," by Paul T. Lin. et al., Ser. No. 07/756,952, now U.S. Pat. No. 5,200,362 filed Sept. 9, 1991, which is a continuation-in-part of Ser. No. 07/576,255, filed Aug. 31, 1990, now abandoned, and claims priority to a Japanese patent application Hei 1-231323, filed Sept. 6, 1989.

FIELD OF THE INVENTION

This invention relates to semiconductor devices in general, and more specifically to resin encapsulated semiconductor devices which have multiple electronic components and to methods for fabricating such devices.

BACKGROUND OF THE INVENTION

Semiconductor devices are widely used in various types of electronic products, consumer products, automobiles, integrated circuit cards, and the like. One feature of semiconductor devices which is important in many of these applications is the small size of a semiconductor device. In addition to making individual semiconductor die (also referred to as chips) as small as possible, it is important that packages which house the die be kept to a minimum size also. Keeping device dimensions as small as possible is not only important to single chip devices, but to multichip devices as well.

In addition to establishing a small device size, manufacturers are also driven to maintaining a low cost of manufacturing devices. Multichip semiconductor devices are gaining popularity because multichip devices significantly increase device packing density on a substrate, for example on a printed circuit (PC) board. However, one aspect which is slowing industry acceptance of multichip devices is prohibitive manufacturing costs. Many multichip devices utilize expensive ceramic substrates and employ additive thin-film processing on semiconductor die, processes which significantly increase manufacturing costs. Due to the high cost associated with many existing multichip devices, semiconductor manufacturers are evaluating low-cost alternatives to multichip devices which utilize resin encapsulation.

Resin encapsulated semiconductor devices are usually packaged by either one of two methods. In one method, a semiconductor die, or a plurality of die, is placed in a package which is then individually mounted on a circuit substrate. In an alternate method, a semiconductor die, or a plurality of die, is mounted directly on the circuit substrate and then is provided with a protective encapsulation structure. The first mentioned method has the advantages that the die is sealed in and protected by the package. The packaged device is easy to test, handle, and install and the encapsulating package provides the desired degree of protection against the environment. In contrast, the second described method in which the die is connected directly to the substrate minimizes the area required by the die and thus allows a very high substrate packing density. In this method, however, an unpackaged die is less easily handled, tested, and burned-in, and is more subject to undesirable effects of the environment.

Thus a semiconductor device, and more specifically a multichip semiconductor device, and a method for its fabrication were needed which would overcome the limitations of the foregoing semiconductor devices and methods.

SUMMARY OF THE INVENTION

This invention provides a low cost, resin encapsulated semiconductor device and a method for its fabrication which also achieves a reduction in the thickness of the device without compromising the ease of handling a fully packaged device. In accordance with one embodiment of the invention, a semiconductor device is fabricated by providing a transfer film on which a pattern of conductive traces is provided. A first electronic component is interconnected to the pattern of conductive traces and a first package body is formed to encapsulate the first electronic component and a first portion of the pattern of conductive traces. The transfer film is then removed to expose a second portion of the pattern of traces on a bottom surface of the first package body. A second electronic component is provided on the bottom surface of the first package body. A second package body is formed to encapsulate the second electronic component while leaving the second portion of the pattern of traces exposed.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
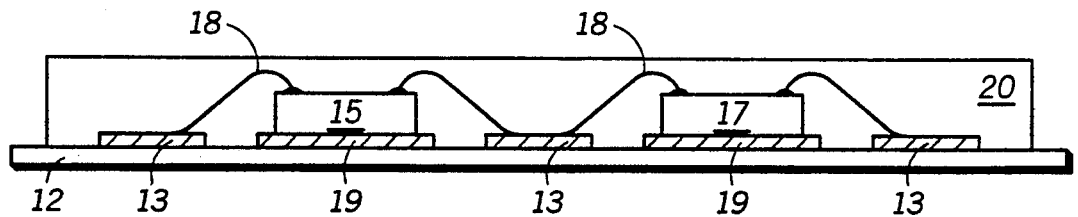
FIGS. 1-7 illustrate, in cross section, process steps in accordance with one embodiment of the invention for the fabrication of a semiconductor device.

FIGS. 1-7 illustrate, in cross section, process steps in accordance with one embodiment of the invention. As illustrated in FIG. 1, a transfer film 12 is provided with a pattern of conductive traces 13 on one side of the film. Transfer film 12 is a sheet film of flexible material such as Kapton tape, or may be another polyimide or polyester material.

A pattern of conductive traces can be formed in a number of different ways onto transfer film 12. In accordance with a preferred embodiment of the invention, a foil of conductive material such as copper is laminated to the transfer film 12 and is subsequently patterned using conventional photolithographic patterning and etching. Alternatively, the pattern of conductive traces can be formed, for example, by evaporating a layer of metal or other conductor onto the surface of the transfer film and then patterning that evaporated layer. If the evaporated layer is not of sufficient thickness to reduce the series resistance to a low enough value, the thickness can be increased by plating additional material onto the evaporated film. Still further, the pattern of conductive traces can be formed by first applying a reverse photoresist mask to the transfer film, evaporating a conductive material onto the photoresist and the transfer film, and then using a lift off process to remove the unwanted conductive material. In yet another embodiment, a pattern of traces is formed from a thin sheet of metal and that pattern of traces is then laminated to the transfer film.

As illustrated in FIG. 1, two semiconductor die 15 and 17 are electrically interconnected to the pattern of conductive traces 13. It is important to note that although two die are specifically illustrated, the number of die used at this stage in manufacturing can be any number, including a single semiconductor die. Other components, in addition to or in place of semiconductor die 15 and 17, may also be electrically coupled to the conductive traces. For example, resistors, diodes, and/or capacitors may be interconnected with traces 13. Interconnection between die 15 and 17 and conductive traces 13 is accomplished by wire bonds 18, but may instead be made by other conventional methods, such as tape automated bonding (TAB), flip chip bonding, direct chip attach, or the like. The area in which the wire bonds, or other interconnections, are joined to conductive traces 13 can be prepared especially to accommodate the attachment of the interconnection. For example, the area to be bonded can be plated with gold, treated to smooth the area, or otherwise treated to enhance the reliability of the interconnection.

The semiconductor die are affixed to die receiving portions 19 which are formed as part of the pattern of conductive traces. Semiconductor die 15 and 17 are attached to portions 19 using conventional die attach materials (not illustrated), for example by solder, conductive epoxy, or the like. Alternatively, the die can be held in place on portion 19 only by wire bonds 18 or other interconnecting methods. If the die is attached to die receiving portion 19, portion 19 can be used, if necessary, as an electrical contact to either or both semiconductor die.

After die 15 and 17 are electrically coupled to conductive traces 13, a first molding operation is performed to encapsulate semiconductor die 15 and 17, wire bonds 18, and one side of the pattern of conductive traces with an encapsulating resin to form a first package body 20, also illustrated in FIG. 1. Package body 20 is formed in a conventional manner, such as by transfer molding, in which the transfer film 12 with the attached semiconductor die 15 and 17 is inserted into a mold cavity and the encapsulating resin is forced into the cavity at a high temperature and high pressure. Alternatively, package body 20 can be made by injection molding, pour molding, or in a "glob top" process. In each of these encapsulating operations, the resin material is formed on one side of transfer film 12; that is, the transfer film, at this stage of the process, defines one side of the package. The resin material thus surrounds the semiconductor die, the wire bonds, and one side of the pattern of conductive traces, plus any additional electronic components which may be attached to the conductive traces.

Figure 2:
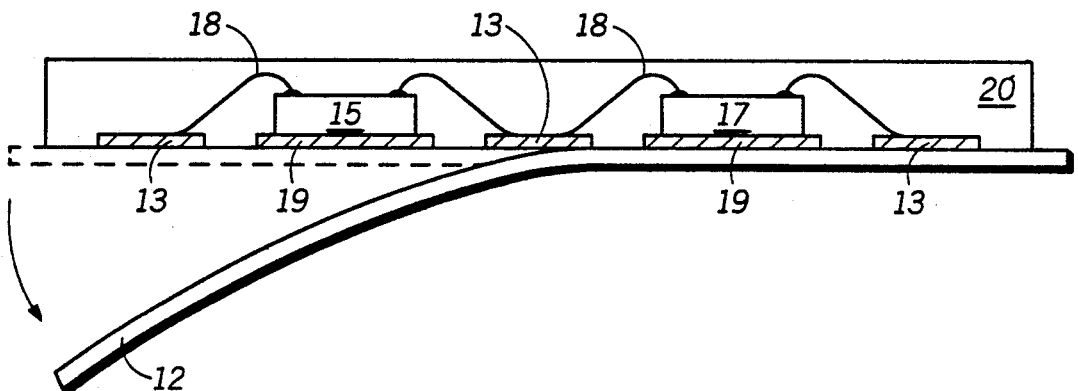

Following the first encapsulation operation, as illustrated in FIG. 2, transfer film 12 is peeled or removed from the surface of the encapsulated device leaving one surface of the conductive traces exposed and available to provide electrical contact to the semiconductor die. In forming the pattern of conductive traces on transfer film 12, for example by applying a layer of electrolytic copper foil to the transfer film, it is especially advantageous if the surface of the foil which is to contact the transfer film is smooth and the opposite side is rough. The smooth surface facilitates the peeling away of the transfer film after the encapsulation operation and the rough surface enhances the adherence of the resin material to the pattern of conductive traces.

After transfer film 12 is removed, a surface of conductive traces 13 is exposed, allowing each of the semiconductor die to be functionally tested through the conductive traces. Testing the die can be accomplished using existing test methods and apparatus, for instance by using conventional test probes, pogo-pins, or sockets.

Figure 3:
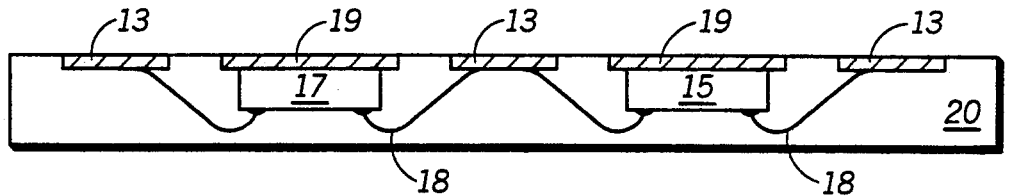
Figure 4:
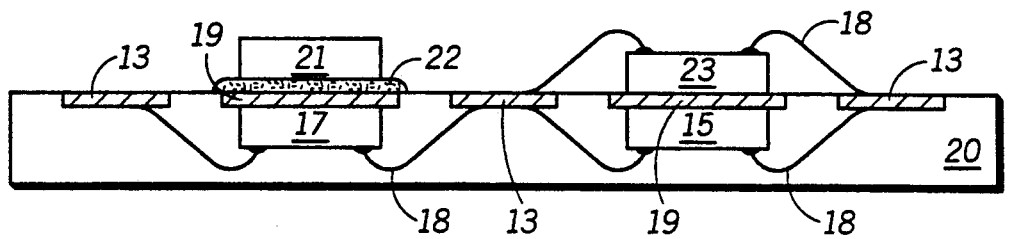

Upon completion of die testing, package body 20 having semiconductor die 15 and 17 and conductive traces 13 incorporated therein is turned over, as illustrated in FIG. 3, in preparation for a second encapsulation. Additional semiconductor die 21 and 23, or other electronic components, are then mounted onto the bottom of package body 20, as represented in FIG. 4. Although FIG. 4 illustrates that semiconductor die 21 and 23 are mounted directly above semiconductor die 17 and 15, respectively, such placement is not necessary in practicing the present invention. Die 21 and 23, and other electronic components, can be positioned in any location on the bottom of package body 20, provided appropriate interconnection to conductive traces 13 can be made. As indicated in FIG. 4, semiconductor die 23 is interconnected to conductive traces 13 using wire bonds 18. While semiconductor die 21 is not illustrated as being interconnected to traces 13 by wire bonded in FIG. 4, interconnections to traces not in view in this cross-section will exist. If it is necessary that electronic components or semiconductor die be electrically separated from other components, a commercially available, electrically insulating adhesive material 22, such as that which separates semiconductor die 21 and 17, may be used. Depending on the type of semiconductor die used, it may be desirable to have two or more die electrically coupled in parallel, as are semiconductor die 15 and 23.

Figure 5:
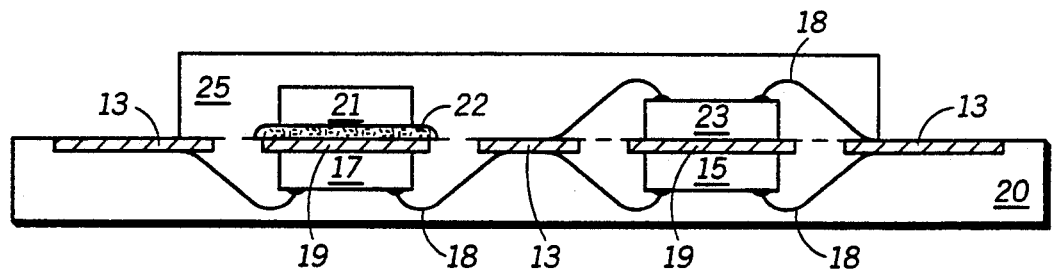

After additional components are attached to the underside of package body 20 and appropriate interconnections are made to conductive traces 13, a second encapsulation step is performed to form a second package body 25, as illustrated in FIG. 5. Package body 25 is also a molded resin package body similar to package body 20. One difference between the two package bodies is that package body 25 is smaller than package body 20. In accordance with the present invention, one of the package bodies should be smaller than another so that a portion of conductive traces is exposed to allow electrical access to the encapsulated semiconductor die. As molded, package body 25 exposes a portion of conductive traces 13 around a perimeter of package body 25.

Figure 6:
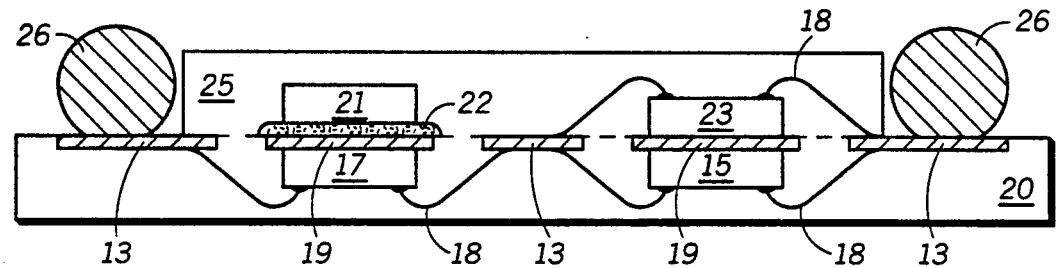
Figure 7:
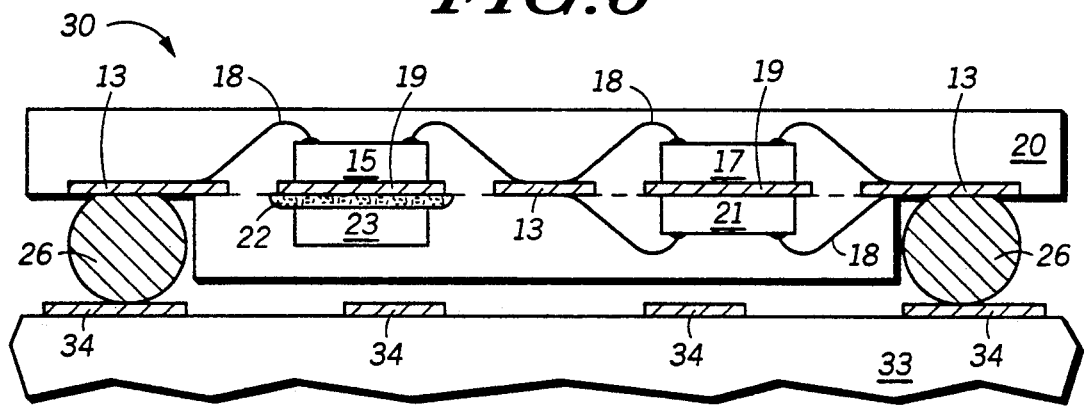

As illustrated in FIG. 6, a solder ball 26 is attached and electrically coupled to each of the exposed portions of conductive traces 13. In order to improve the adhesion between solder balls 26 and traces 13 and the solderwettability of the traces, intermediate conductive layers (not illustrated) can be added to the exposed portions of the conductive traces. Common materials used to promote adhesion and wettability include gold, chromium, and the like. Solder balls 26 should be of sufficient size to extend above package body 25, as illustrated in FIG. 6. Having the solder balls extend above package body 25 allows the solder balls to be easily coupled to a substrate, such as a PC board, without interference from the package body. FIG. 7 illustrates a completed multichip semiconductor device 30 as the device would be oriented on a conventional substrate 33 which has a plurality of conductive traces 34 corresponding in location to solder balls 26.

Testing of semiconductor die 21 and 23 of device 30 can be accomplished at various points in manufacturing. For example, the die may be functionally tested after the second encapsulation process but before the solder balls are attached, the stage represented in FIG. 5. Alternatively, testing can be done after the solder balls are attached.

In order to obtain the highest yield for device 30, it is recommended that lower yielding die be encapsulated first, and that higher yielding die be encapsulated second. By doing so, the die which are most likely to fail are identified during the first functional testing operation which occurs after the first encapsulation step and before attachment of additional components to the other side of the device. Early failure identification eliminates unnecessary manufacturing steps beyond the first encapsulation. In reference to the figures, the steps illustrated in FIGS. 4-6 are eliminated if either die 15 or die 17 is recorded as a failed part and subsequent manufacturing costs are avoided. On the other hand, if die 21 and die 23 are lowering yielding than die 15 and die 17, it is more likely that manufacturing will continue through to the second encapsulation step before a failure is identified.

Figure 8:
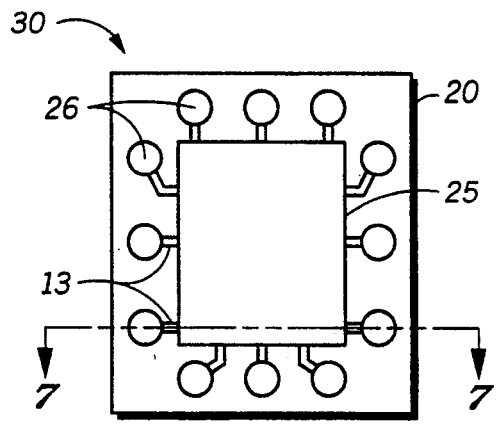
FIG. 8 illustrates, from a bottom view, the semiconductor device illustrated in FIG. 7.

FIG. 8 is a bottom view of device 30. Line of FIG. 8 represents the portion of device 30 which the cross-section of FIG. 7 represents. As indicated in FIG. 8, and as mentioned above, package body 25 is smaller than package body 20 so that portions of conductive traces of 13 are exposed. Solder balls 26 are electrically and physically coupled to exposed portions of traces 13. Solder balls of device 30 have a peripheral configuration. In other words, solder ball placement is designed to follow along the periphery or perimeter of the package bodies. As an alternative to a peripheral solder ball configuration, an array configuration may also be used in accordance with the present invention, as demonstrated below.

The remaining figures which illustrate further embodiments of the present invention incorporate many of the same or similar elements as those described above in reference to device 30. Therefore, like reference numerals designate identical or corresponding parts throughout the several views which follow.

Figure 9:
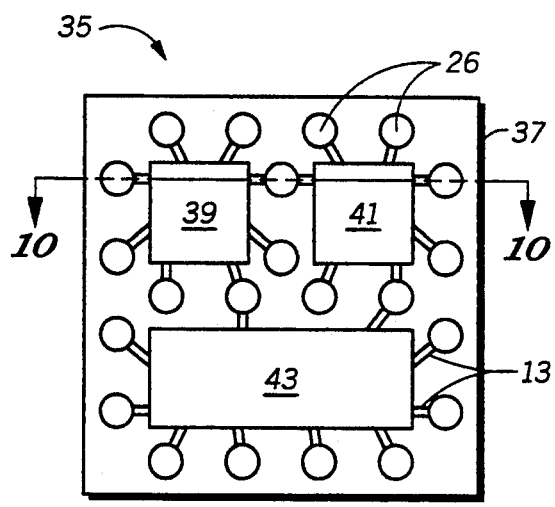
FIG. 9 illustrates, from a bottom view, another semiconductor device in accordance with the present invention.
Figure 10:
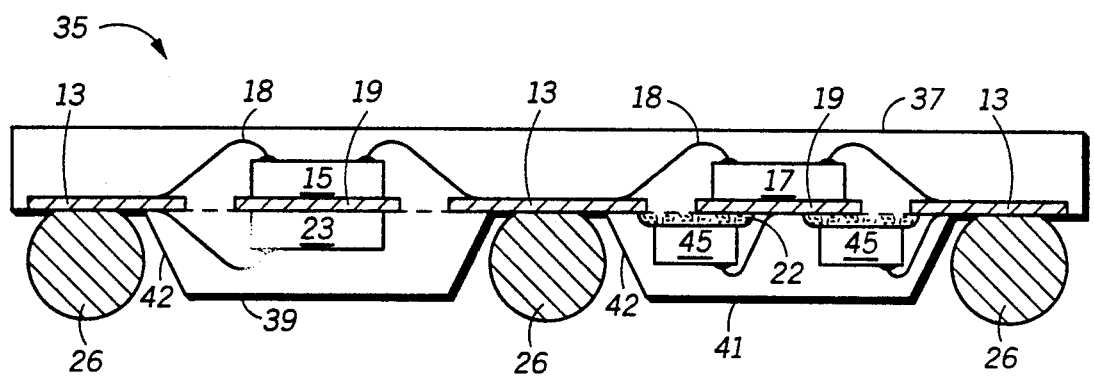
FIG. 10 illustrates, in cross-section, the semiconductor device of FIG. 9, as it would appear along the line 10—10.

FIG. 9 is a bottom view of a multichip semiconductor device 35 having a solder ball array configuration. A cross-sectional view of device 35 taken along the line 10—10 is illustrated in FIG. 10. Rather than having one package body formed on an opposing side of another package body, device 35 has three package bodies, package bodies 39, 41, and 43, formed opposite a first package body 37. Because package bodies 39, 41, and 43 are spaced apart from one another, there is room to place solder balls 26 between the packages. Thus, the present invention is not limited to a peripheral solder ball configuration but may also include an array configuration such as that illustrated in FIG. 9.

The cross-sectional view of device 35 illustrated in FIG. 10 demonstrates incorporation of components other than just semiconductor die. Electronic components 45, which may be passive components such as resistors, diodes, decoupling capacitors, or the like are electrically coupled to conductive traces 13 by wire bonds 18. As discussed above, other interconnecting methods may be employed instead of wire bonds. For example, components 45 can be soldered directly to appropriate conductive traces. It necessary, components 45 can be electrically isolated from some conductive traces or from other components by using electrically insulating adhesive material 22.

Also illustrated in FIG. 10 is a different package body shape. Package bodies 39 and 41 have tapered sidewalls 42. Although not a requirement of the present invention, tapered sidewalls for packages which are formed on the bottom side of a device in accordance with the present invention facilitate attachment of solder balls 26. Vertical sidewalls on package bodies which are adjacent to solder ball locations may impede manufacturing equipment used to position the solder balls in place. Tapered sidewalls provide more space to accommodate various manufacturing equipment. Tapered sidewalls also aid in releasing a package body from a mold tool.

Figure 11:
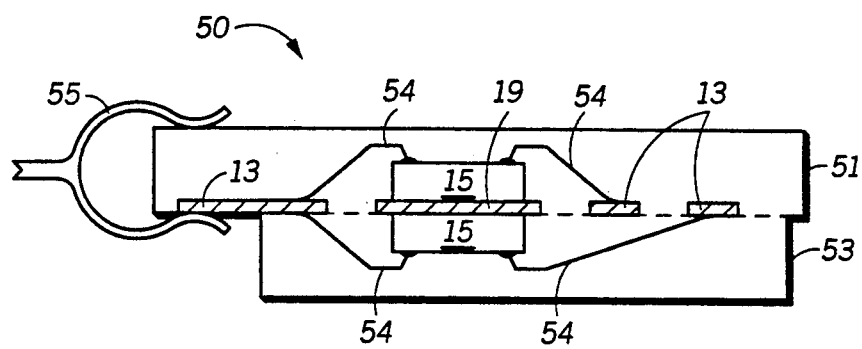
FIG. 11 illustrates, in cross-section, a semiconductor device in accordance with the present invention which is compatible with existing SIMMs.

FIG. 11 illustrates in a cross-sectional view another embodiment of the present invention. The method described in reference to FIGS. 1-6 can be used to fabricate a multichip semiconductor device 50. A portion of device 50 is illustrated in a three-dimensional view in FIG. 12. One difference in manufacturing device 50 from the method previously described is that low loop height wire bonds 54 are used to electrically couple semiconductor die 15 to conductive traces 13. Low loop height wire bonds 54 include bends which permit the maximum height of the wire bond to be lower than if using rounded wire bonds. The lower wire bond height enables package thickness to be reduced.

Figure 12:
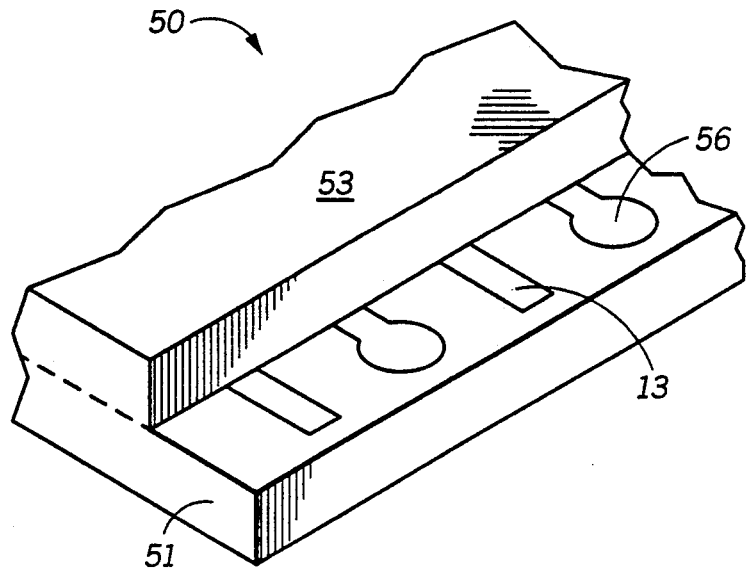
FIG. 12 illustrates, in a three-dimensional view, a portion of the semiconductor device of FIG. 11.

Device 50 is designed to be compatible with existing single-in-line memory modules (SIMMs). SIMMs typically include a plurality of identical semiconductor die, particularly dynamic random access memories (DRAMs). Conventional SIMMs include a plurality of die or a plurality of individually packaged devices attached to one side of a substrate, such as a PC board. The substrate is provided with edge connectors along one edge which fit into a socket. Device 50 of the present invention has a first package body 51 and a second package body 53. Package body 53 is smaller than package body 51 in order to allow a portion of conductive traces 13 to be exposed along an edge of package body 51. Unlike previous embodiments, only portions of conductive traces along one edge of device 50 are exposed, thus providing a single-in-line contact configuration. Rather than forming solder balls on the exposed portions of conductive traces 13 to provide external electrical accessibility to semiconductor die 15, device 50 is inserted into a conventional SIMM socket (not illustrated in full) such that each conductive trace makes electrical contact to a connector in the socket, for example to a C-clamp 55. To improve contact area between traces 13 and socket connectors, the traces can terminate with a pad 56, as illustrated in FIG. 12.

Figure 13:
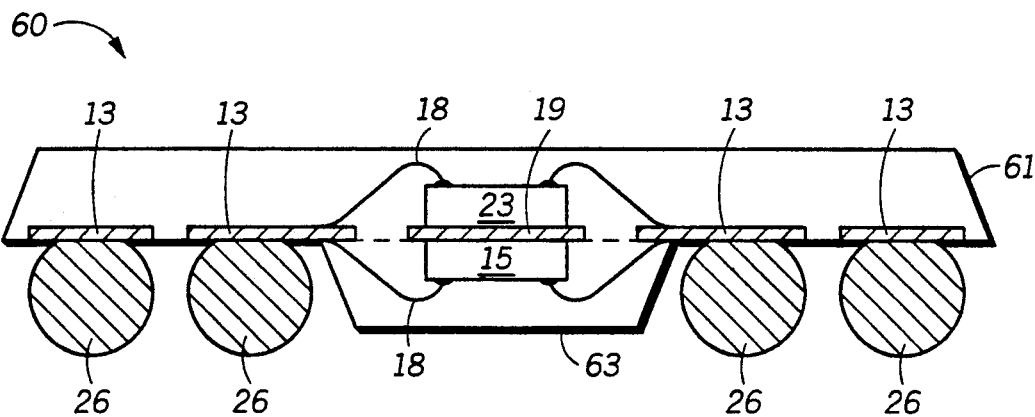
FIG. 13 illustrates, in cross-section, yet another embodiment of the present invention in which a semiconductor device functions as an emulator.

Another embodiment of the present invention is illustrated in a cross-sectional view in FIG. 13. A multichip semiconductor device 60 has a first package body 61 and a second package body 63 formed in a method similar to that described in reference to FIGS. 1–6. Package bodies 60 and 63 both have tapered sidewalls to aid in releasing the packages from a mold tool and to facilitate subsequent manufacturing operations, such as solder ball attachment. Device 60 has two semiconductor die 15 and 23. In a preferred form, semiconductor die are dissimilar in functionality, but cooperate with one another to performed a desired function. As an example, semiconductor die 23 may be a core microprocessor suitable for use in a variety of applications. Semiconductor die 15 may be a read-only-memory (ROM) programmed with an application-specific ROM code. In this example, device 60 acts as an emulator of an application-specific microprocessor.

Use of an emulator device, such as device 60, has several advantages over using an application-specific microprocessor. One advantage is that the same core microprocessor die can be used in several devices, as opposed to having a different microprocessor for each application. Thus, microprocessor manufacturing is simplified to one core product. Although a different ROM die and a different ROM manufacturing sequence is required for each application, ROM devices, in general, are higher yielding than microprocessors. Therefore, the overall yield with respect to die manufacturing for a core microprocessor and application-specific ROMs is likely to be higher that the die yield for application-specific microprocessors. Furthermore, an emulator device such as that illustrated in FIG. 13 is smaller than an equivalent application-specific microprocessor device because the ROM is on a separate die which lies underneath the core microprocessor. In conventional application-specific microprocessors, the ROM is on-chip, making the die size, and in turn the overall device size, larger than if employing an emulator device in accordance with the present invention.

In another embodiment, device 60 includes a core microprocessor and a co-processor. For instance, die 23 may be a core microprocessor while die 15 is an additional processor which adds floating point capability or a cache. Thus, device 60 provides a way to upgrade the function of a core microprocessor in one package. As in the previous embodiment which employed a ROM die, device 60 allows a standard manufacturing procedure for all application-specific devices up to the point of adding components, such as die 15, to the bottom of the first package body 61.

Also in accordance with the present invention, a resin encapsulated multichip semiconductor device can be fabricated using a tape or a substrate having a conductive pattern on two sides and leaving the substrate in the device. A multichip semiconductor device 70 which includes a substrate is illustrated in a cross-sectional view in FIG. 14. Device 70 includes many of the elements described previously, therefore these elements are labeled the same as in the earlier figures. In addition, device 70 includes a substrate 72. Substrate 72 can be a polyimide or polyester tape having a pattern of conductive traces 13 on both a top and a bottom surface of the substrate. In an alternative embodiment, substrate 72 can be a conventional printed circuit board made of a resin filled glass fabric, such as FR4 or G10 materials. A first semiconductor die 74 is mounted on a top surface of substrate 72 and is electrically coupled to conductive traces 13 by wire bonds 18. Die 74, wire bonds 18 which are associated with die 74, and the pattern of conductive traces 13 on the top of substrate 72 are encapsulated by a first package body 76. The entire top pattern of traces can be encapsulated by package body 76, or alternatively only a portion of the pattern of traces can be encapsulated. Package body 76 is formed in a manner similar to that described in reference to FIG. 1. However, rather than removing substrate 72 to form an additional package body, the substrate is left in place. A second semiconductor die 78 is then mounted to a bottom surface of substrate 72, and appropriate electrical connections are made between die 78 and conductive traces 13 by wire bonds 18. A second package body 80 is formed to encapsulate die 78, wire bonds associated with die 78, and a portion of the pattern of conductive traces 13 on the bottom of substrate 72. After forming package body 80, solder balls 26 are attached to portions of the pattern of the conductive traces which are exposed on the bottom of substrate 72.

Figure 14:
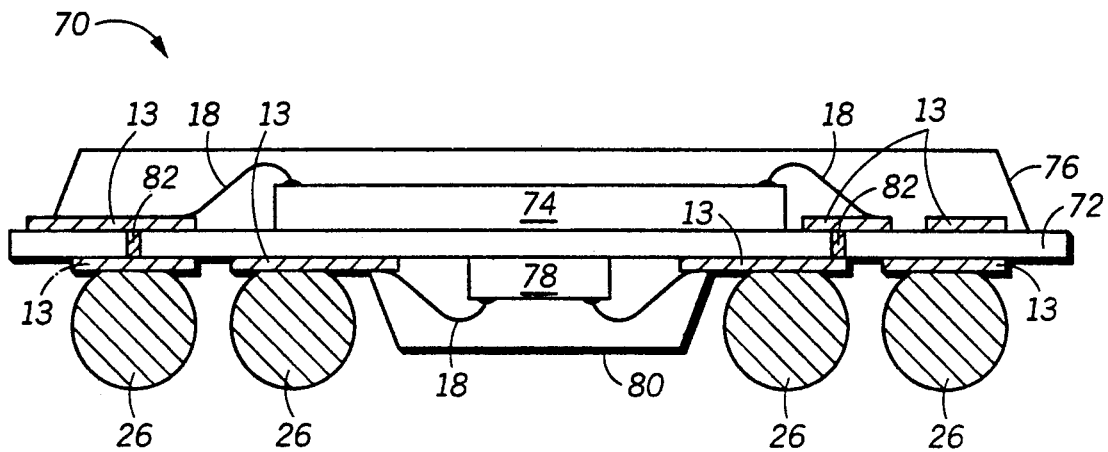
FIG. 14 illustrates, in cross-section an embodiment of the present invention in which a substrate or tape remains in a multichip semiconductor device.

By having a pattern of conductive traces on both the top and bottom surfaces of substrate 72 in device 70, it is necessary that the traces be routed to one side of the device to facilitate conventional horizontal mounting of the device to a user substrate. As illustrated in FIG. 14, the traces which are on the top of substrate 72 are routed to traces, and eventually to solder balls, on the bottom of substrate 72 by conductive through-holes 82. Solder balls 26 are attached to exposed portions of traces 13 on the bottom of substrate 72. The exposed portions of traces 13 may be configured as pads, such as pads 56 illustrated in FIG. 12.

As indicated by FIG. 14, a device in accordance with the present invention is not limited to having a semiconductor die, or other electronic component, on the top of substrate 72 which is electrically coupled just to those traces on the top surface of the substrate. Similarly, a component on the bottom surface of the substrate need not be coupled only to traces on the bottom surface of substrate 72. Moreover, traces can be shared between components. Typical examples of shared traces include traces used for power and traces used for ground. Although FIG. 14 illustrates that device 70 has only two semiconductor die, it is also important to realize that any number of electronic components, as well as any type, can be used on either surface of substrate 72 in accordance with the present invention. Furthermore, it is not necessary the substrate 72 have only two conductive layers, one on a top surface and one on a bottom surface. A substrate having three or more conductive layers is also suitable for use with the invention.

The foregoing description and illustrations contained herein demonstrate many of the advantages associated with the present invention. In particular, it has been revealed that a manufacturing process which utilizes a transfer film approach can be used to manufacture low cost multichip semiconductor devices. Furthermore, multichip semiconductor devices in accordance with the present invention can be very small by having semiconductor die or other components at two different levels within a device. The two levels are created as a result of two encapsulation operations, the first of which preferably encapsulates lower yielding die while the second is used to encapsulate higher yielding die. Unlike many conventional multichip devices, functional testing can occur prior to the second encapsulation operation. Therefore, failures can be detected early and manufacturing costs associated with unnecessary processing can be avoided. Moreover, it has been demonstrated that the present invention has a wide variety of applications, including SIMM applications and use in application-specific products by way of emulation.

Thus it is apparent that there has been provided, in accordance with the invention, a multichip semiconductor device and method for its fabrication which overcomes the problems associated with the prior art devices and methods. Although the invention has been described and illustrated with reference to specific embodiments thereof, it is not intended that the invention be limited to these illustrative embodiments. Those skilled in the art will recognize that variations and modifications can be made without departing from the spirit of the invention. For example, the pattern of conductive traces used on a transfer film is not restricted by the present invention. The conductive trace pattern is dependent upon the types and configurations of the various semiconductor die and electronic components used in a device. In addition, thermal dissipation in a device of the present invention can be improved by providing additional solder balls which couple the conductive traces to a substrate. Solder balls, in addition to those which may be used for electrical connection, not only improve thermal dissipation but also improve mechanical strength of the device. Furthermore, it is not necessary that solder balls be used to electrically couple a device in accordance with the present invention to a substrate. Other coupling methods known in the industry, such as use of an anisotropically conductive compliant elastomer, an adhesive having conductive fillers, and clip-type connectors, are also suitable. In addition, the present invention is not limited to any specific number or kind of semiconductor die used. Also, other components may be used in place of, or in addition to, semiconductor die. As an example, commonly used passive components, including resistors and capacitors, are likely to be advantageous in devices in accordance with the invention. Additionally, materials and methods other than those described for forming the conductive traces and for encapsulating the devices are possible. Also, solder ball configurations other than those specifically illustrated are anticipated as being suitable in practicing the invention. Thus it is intended to encompass within the invention all such variations and modifications as fall within the scope of the appended claims.

We claim:

1. A process for fabricating a semiconductor device comprising the steps of:
   providing a transfer film;
   providing a pattern of conductive traces on said transfer film, the pattern of traces having a first side and a second side;
   providing a first and a second semiconductor die;
   forming first electrical interconnections between the first side of the pattern of conductive traces and the first semiconductor die;
   providing a resin material on one side of the transfer film to form a first package body which encapsulates the first semiconductor die, the first electrical interconnections, and the first side of the pattern of conductive traces, the first package body having a bottom surface defined by the transfer film;
   removing said transfer film to expose the second side of the pattern of conductive traces on the bottom surface of the first package body;
   positioning the second semiconductor die on the bottom surface of the first package body;
   forming second electrical interconnections between the second side of the pattern of conductive traces and the second semiconductor die; and
   providing a resin material to form a second package body which encapsulates the second semiconductor die, the second electrical interconnections, and a first portion of the second side of the pattern of conductive traces such that a second portion of the second side of the pattern of conductive traces is exposed.

2. The process of claim 1 wherein said step of forming a pattern of conductive traces comprises the steps of:
   forming a continuous layer of conductive material on said transfer film; and
   selectively etching said continuous layer to form said pattern of conductive traces.

3. The process of claim 2 wherein said step of forming a continuous layer comprises laminating a layer of conductive foil to said transfer film.

4. The process of claim 2 wherein said step of forming a continuous layer comprises evaporating a layer of metal onto said transfer film.

5. The process of claim 1 wherein the step of providing a transfer film comprise providing a transfer film comprised of either a polyimide or a polyester.

6. The process of claim 1 wherein the steps of providing first electrical interconnections and providing second electrical interconnections respectively comprise providing a first plurality of wire bonds and providing a second plurality of wire bonds.

7. The process of claim 1 further comprising the step of attaching a plurality of solder balls to the exposed second portion of the second side of the pattern of conductive traces.

8. The process of claim 1 wherein the step of providing a transfer film comprises providing a flexible, polymer transfer film, and wherein the step of removing the transfer film comprises peeling the transfer film away from the first package body.

9. The process of claim 1 wherein the step of providing a resin material to form a second package body comprises:
   providing a resin material to form a second package which is adjacent the bottom surface of the first package body and is smaller in area than the first package body so that the second portion of the second side of the pattern of conductive traces is exposed.

10. A process for fabricating a semiconductor device comprising the steps of:
    providing a transfer film having a pattern of conductive traces formed on a surface thereof;
    providing a first electronic component;
    electrically coupling the first electronic component to the pattern of conductive traces;
    forming a first package body which encapsulates the first electronic component and a first portion of the pattern of conductive traces, wherein a bottom surface of the first package body is defined by the transfer film;
    removing the transfer film to expose a second portion of the pattern of conductive traces on the bottom surface of the first package body;

providing a second electronic component on the bottom surface of the first package body;

electrically coupling the second electronic component to the pattern of conductive traces; and forming a second package body adjacent the first package body which encapsulates the second electronic component and is smaller in area than the first package body so that the second portion of the pattern of conductive traces remains exposed.

11. The process of claim 10 wherein the steps of forming a first package body and forming a second package body each comprise forming a resin package body.

12. The process of claim 10 further comprising the step of attaching a plurality of solder balls to the second portion of the pattern of conductive traces.

13. The process of claim 10 wherein the steps of providing a first electronic component and providing a second electronic component each comprise providing a semiconductor die.

14. The process of claim 10 wherein the step of providing a transfer film comprises providing a flexible, polymer transfer film, and wherein the step of removing the transfer film comprises peeling the transfer film away from the first package body.

* * * * *